(12) United States Patent
Tang et al.

(10) Patent No.: US 7,532,181 B2
(45) Date of Patent: May 12, 2009

(54) VISIBLE AND INVISIBLE IMAGE DISPLAY (75) Inventors: Ching W. Tang, Rochester, NY (US);
Liang-Sheng Liao, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 701 days.

(21) Appl. No.: 11/185,640

(22) Filed: Jul. 20, 2005

(65) Prior Publication Data

US 2007/0018915 A1    Jan. 25, 2007

(51) Int. Cl.
    G09G 3/30    (2006.01)
(52) U.S. Cl. ............... 345/76; 345/690; 345/694; 345/695; 345/696
(58) Field of Classification Search ............ 345/76, 345/690, 694–696
    See application file for complete search history.

(56) References Cited

U.S. PATENT DOCUMENTS

| | | |
|---|---|---|
| 4,689,522 A | 8/1987 | Robertson |
| 4,724,356 A | 2/1988 | Daehler |
| 4,799,050 A | 1/1989 | Prince et al. |
| 4,801,844 A | 1/1989 | Barrow et al. |
| 4,930,236 A | 6/1990 | Hart |
| 5,003,179 A | 3/1991 | Pollack |
| 5,583,349 A | 12/1996 | Norman et al. |
| 5,712,651 A | 1/1998 | Tomiyasu |
| 5,937,272 A | 8/1999 | Tang |
| 5,965,907 A | 10/1999 | Huang et al. |
| 6,066,357 A | 5/2000 | Tang et al. |
| 6,142,637 A | 11/2000 | Cohen et al. |
| 6,384,529 B2 | 5/2002 | Tang et al. |
| 6,567,190 B1 * | 5/2003 | Reele .......................... 358/474 |
| 6,570,584 B1 * | 5/2003 | Cok et al. .................... 345/690 |
| 6,787,995 B1 | 9/2004 | Shinoda et al. |
| 6,791,258 B2 | 9/2004 | Haase et al. |
| 6,838,819 B2 | 1/2005 | Kim et al. |
| 6,855,438 B2 | 2/2005 | Oshiyama et al. |
| 6,864,875 B2 | 3/2005 | Drazaic et al. |
| 6,882,383 B1 | 4/2005 | Su |

\* cited by examiner

*Primary Examiner*—Richard Hjerpe
*Assistant Examiner*—Leonid Shapiro
(74) *Attorney, Agent, or Firm*—Raymond L. Owens (57) ABSTRACT

A display for producing either visible or invisible images to the human eyes comprising a plurality of pixels wherein each of the pixels includes one or more visible radiation subpixels capable of producing visible radiations to the human eyes and at least one invisible radiation subpixel capable of producing invisible radiations to the human eyes; and means for selectively operating the display to activate either visible or invisible radiation subpixels to respectively producing visible or invisible images to the human eyes.

20 Claims, 5 Drawing Sheets

VISIBLE AND INVISIBLE IMAGE DISPLAY

FIELD OF INVENTION

The present invention relates to a display capable of selectively displaying visible or invisible images. More specifically, the present invention relates to a display using red, green, blue, and infrared light-emitting diodes as radiation subpixels and selectively producing full-color or infrared images to the human eyes.

BACKGROUND OF THE INVENTION

Visible image displays (capable of displaying visible images to the human eyes), such as the full-color displays, are well known and are based on a variety of technologies such as cathode ray tubes, liquid crystal, and solid-state light-emitting devices including inorganic Light-Emitting Diodes (LEDs) and Organic Light-Emitting Diodes (OLEDs). In a common full-color display (or RGB display), each pixel is composed of three primary color radiation subpixels (or color elements), i.e., red, green, and blue color radiation subpixels. By combining the emission, transmission, or reflection from each of these three primary color radiation subpixels in an additive color system, a wide variety of colors can be achieved and images can be displayed with a proper drive circuitry. There are numerous types of full-color displays disclosed in the prior art. The non-limiting examples can be found in U.S. Pat. Nos. 6,882,383, 6,864,875, 6,855,438, 6,838,819, 6,791,258, 6,787,995, 6,384,529, 6,142,637, 6,066,357, 5,965,907, 5,937,272, 5,712,651, 5,583,349, 5,003,179, 4,801,844, 4,799,050, and 4,689,522.

There is another type of display, called invisible image display (capable of displaying invisible images to the human eyes, but the images could be perceived by the human eyes only with a wavelength conversion device), such as an infrared display (or IR display). The invisible image display can also be made based on the technologies such as liquid crystal and solid-state light-emitting devices. In an IR display, each display pixel can be composed of an infrared device. Each infrared device in the IR display can emit, transmit, or reflect infrared wavelength. Infrared images can be displayed on the IR display with a proper drive circuitry. And the infrared images can be perceived by the human eyes through night vision goggles or other wavelength conversion devices. IR displays have been disclosed, such as, in U.S. Pat. Nos. 4,930,236 and 4,724,356; and in JP 02,094,340.

It is well known that the visible image displays are widely used in our daily life. The invisible image display, such as the IR display, can also have its special applications. For example, it can be used as a personal night vision display in a combat field or a navigator display in an aircraft or in a spacecraft.

In some cases, for example, as personal equipment for a soldier in a future combat field, both a visible image display and an invisible image display are needed. The visible image display is used for the daylight vision and the invisible image display is used for the night vision with a wavelength conversion device. In this situation, any personal equipment with lightweight, low power consumption, and easy-to-use is critical to the soldiers. However, equipped with two displays would increase the carrying weight, demand more electrical power consumption, need longer time to switch to another display, and even increase the risk to life in the combat field.

Cok et al. disclosed an OLED display having more than 3 subpixels in each pixel in U.S. Pat. No. 6,570,584 B1, wherein the $4^{th}$ subpixel is an OLED which can have an emission outside the gamut defined by red, green, and blue. The $4^{th}$ subpixel can be an infrared OLED. According to the disclosure, the $4^{th}$ subpixel is to expand the gamut or encode with additional information, and the subpixels in each pixel are made of OLEDs.

SUMMARY OF THE INVENTION

It is therefore an object of the present invention to propose a display capable of selectively producing visible images or invisible images to the human eyes.

The object is achieved by a display for producing either visible or invisible images to the human eyes comprising:

a) a plurality of pixels wherein each of the pixels includes one or more visible radiation subpixels capable of producing visible radiations to the human eyes and at least one invisible radiation subpixel capable of producing invisible radiations to the human eyes; and b) means for selectively operating the display to activate either visible or invisible radiation subpixels to respectively producing visible or invisible images to the human eyes.

The present invention combines the visible radiation subpixels and the invisible radiation subpixels into each pixel in a display to make the display have the dual functions of selectively displaying visible or invisible images to the human eyes. It is an advantage of the present invention that, instead of using two displays with single displaying function, using the dual functional display as a personal equipment can reduce the carrying weight, reduce electrical power consumption, and increase the convenience for use. It is another advantage of the present invention that the dual functional display can be made portable, wearable, flexible, and light-weight for use in a combat field.

BRIEF DESCRIPTION OF THE DRAWINGS

It will be understood that FIGS. 1-6 are not to scale. The sizes, the patterns, and the pattern arrangement, of the radiation subpixels in each pixel can be varied according to the requirement of real applications.

DETAILED DESCRIPTION OF THE INVENTION

In order to facilitate the description of the present invention, several terms are defined here: The term "pixel" is employed in its art-recognized usage to designate an area of a display panel that can be stimulated to have color radiation independently of other areas. Each pixel can include one or more subpixels (or color elements). The subpixel is the smallest addressable unit in a display panel. The term "visible radiation" is employed to describe a radiation that can be perceived directly by the human eyes. The visible radiation has a spectral wavelength in the range of from 400 nm to 800 nm. The wavelength range of from 400 nm to 800 nm is commonly defined as the "visible spectrum". The term "invisible radiation" is employed to describe a radiation that cannot be perceived directly by the human eyes. In other words, the invisible radiation has a spectral wavelength out of the visible spectrum. The term "infrared radiation" means a radiation that has a spectral wavelength greater than 800 nm. The term "visible radiation subpixel" is meant as a subpixel for use in forming an image by emitting, transmitting, or reflecting a visible radiation. The term "invisible radiation subpixel" is meant as a subpixel for use in forming an image by emitting, transmitting, or reflecting an invisible radiation. The term "mono-color" is employed to describe a display panel that is capable of emitting, transmitting, or reflecting a single visible radiation. The term "multi-color" is employed to describe a display panel that is capable of emitting, transmitting, or reflecting the visible radiations with different spectral wavelength. The term "full-color" is employed to describe a display panel that is capable of emitting, transmitting, or reflecting the visible radiations having the red, green, and blue colors. The red, green, and blue colors constitute the three primary colors from which all other colors can be generated by appropriately mixing these three primaries.

In order to appreciate the construction of the visible and invisible image display in the present invention, a prior art full-color display will be described with reference to FIGS. 1 and 2.

Figure 1:
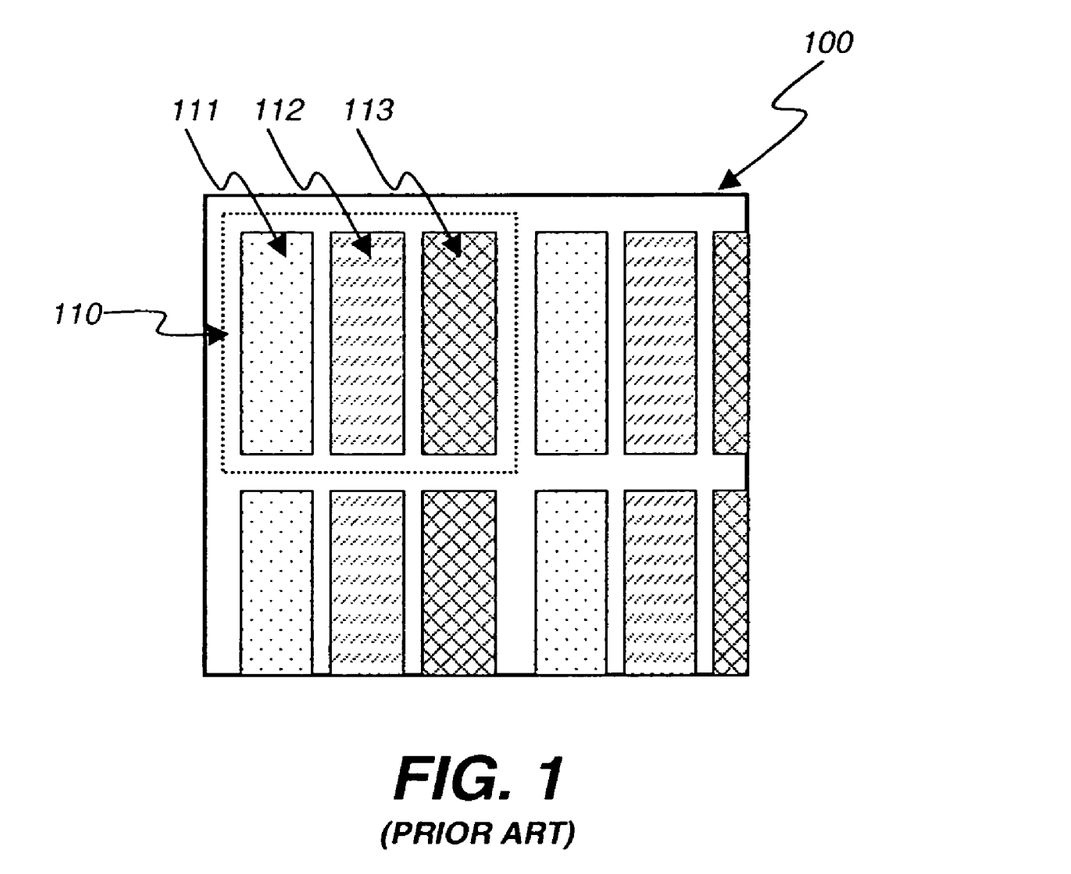
FIG. 1 is a schematic diagram illustrating a typical pixel pattern in a prior art display.

Shown in FIG. 1 is a typical pixel pattern of a full-color display in prior art. Display 100 is comprised of an array of pixels. One of the pixels, pixel 110, includes three radiation subpixels: red radiation subpixel 111, green radiation subpixel 112, and blue radiation subpixel 113. The human eyes can perceive the red, green, and blue color from all the radiation subpixels. If the radiation subpixels are devices using liquid crystals, these radiation subpixels are capable of transmitting or reflecting light. If the radiation subpixels are LEDs or OLEDs, these radiation subpixels are capable of self-emitting light directly.

Figure 2:
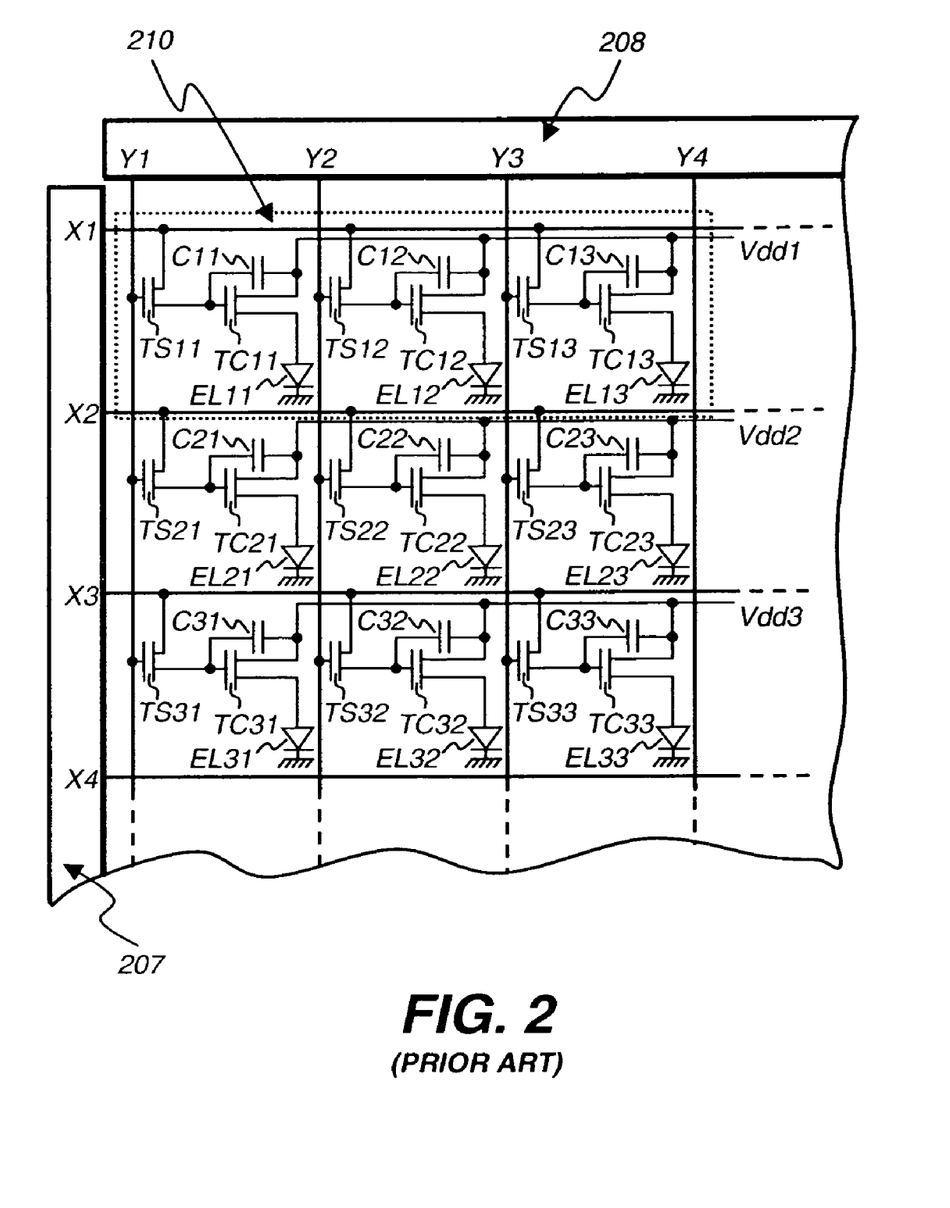
FIG. 2 depicts a cutaway view of a circuit diagram that can be used for driving a prior art active matrix OLED display.

As a typical circuitry example in FIG. 2, there is shown a cutaway view of a circuit diagram that can be used for driving a prior art active matrix OLED display. The term "active matrix" means the radiation subpixels are arranged as a matrix (an array of radiation subpixels) and each radiation subpixel in the matrix can be independently driven by a circuit containing at least one active component, such as a transistor. The active matrix in FIG. 2 is composed of X-direction driving circuit 207, Y-direction driving circuit 208, and an array of pixels. One of the pixels is indicated as pixel 210 containing a red OLED EL11, a green OLED EL12, and a blue OLED EL13. Pixel 210 can be referred to pixel 110 in FIG. 1. EL11, EL12, and EL13 can be referred to radiation subpixels 111, 112, and 113, respectively, in FIG. 1. Including in the active matrix are also X-direction signal lines (Xm): X1, X2, X3, X4, . . . , Y-direction signal lines (Yn): Y1, Y2, Y3, Y4, . . . , and power supply lines (Vddm): Vdd1, Vdd2, Vdd3, . . . In the array of pixels, the thin-film transistors (TFTs) used for switching are (TSmn): TS11, TS12, TS13, . . . , TS21, TS22, TS23, . . . , TS31, TS32, TS33, . . . ; the TFTs used for current control are (TCmn): TC11, TC12, TC13, . . . , TC21, TC22, TC23, . . . , TC31, TC32, TC33, . . . ; the radiation subpixels are OLED (ELmn): EL11, EL12, EL13, . . . , EL21, EL22, EL23, . . . , EL31, EL32, EL33, . . . ; and the capacitors are (Cmn): C11, C12, C13, . . . , C21, C22, C23, . . . , C31, C32, C33, . . . In this active matrix, each of the radiation subpixels can be individually controlled or selected by one of X-direction signal lines and one of Y-direction signal lines. For example, when the switching TFT TS11 is made the "on" state by X-direction signal line X1 and Y-direction signal line Y1, the current control TFT TC11 comes the "on" state accordingly. Thus, an electric current supplied from a power supply line Vdd1 flows in the OLED EL11, which results in red radiation. Based on the operational principle, if any one of the three radiation subpixels in pixel 210 is "on" at a time, red, green, or blue color can be seen at that time; if any two of the three radiation subpixels in pixel 210 are "on" at the same time, the combined color of red with green, red with blue, or green with blue can be seen at the same time; if all of the three radiation subpixels are "on" at the same time, a white color can be seen. Furthermore, if each element emits light with adjustable intensity, more combined colors can be seen. In other words, pixel 210 can not only emit the three primary colors but also emit different colors other than the primary colors in the whole region of the visible spectrum.

Turning now to the description of the visible and invisible image display in accordance with the present invention. The display in the present invention comprises an array of pixels, wherein each of the pixels includes one or more visible radiation subpixels capable of producing visible radiation to the human eyes, wherein each of the pixels also includes one invisible radiation subpixel capable of producing invisible radiation to the human eyes, and wherein the display is capable of selectively producing visible or invisible images to the human eyes. The following figures are several embodiments of the visible and invisible image display in accordance with the present invention.

Figure 3:
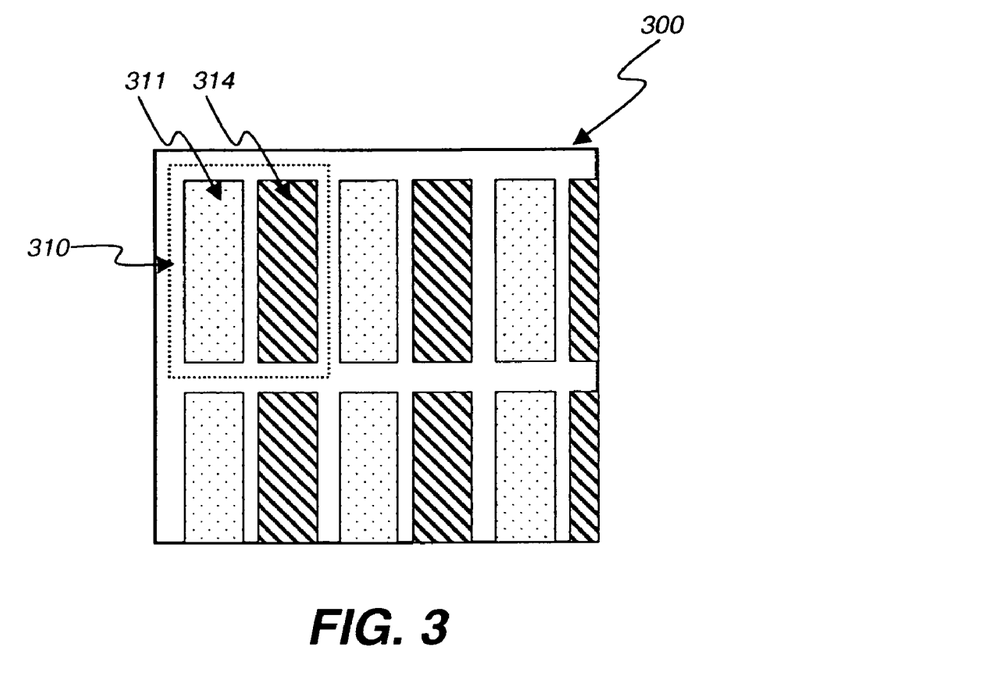
FIG. 3 is a schematic diagram illustrating a pixel pattern in a display in accordance with the present invention.

There is shown a pixel pattern of a visible and invisible image display in accordance with the present invention in FIG. 3. Display 300 is comprised of an array of pixels. One of the pixels, pixel 310, includes two radiation subpixels: the visible radiation subpixel 311, and the invisible radiation subpixel 314. The visible radiation subpixel 311 can be any device capable of producing a mono-color radiation in the region of visible spectrum, and the invisible radiation subpixel 314 can be any device capable of producing an invisible radiation, such as an infrared radiation. Thus, the display is capable of selectively producing mono-color or infrared images. The mono-color radiation produced from the visible radiation subpixel 311 can be a red-, pink-, magenta-, orange-, yellow-, green-, cyan-, olive-, royal-, navy-, blue-, or a purple-, color radiation having a spectral full width at half maximum (FWHM) of less than 150 nm.

Figure 4:
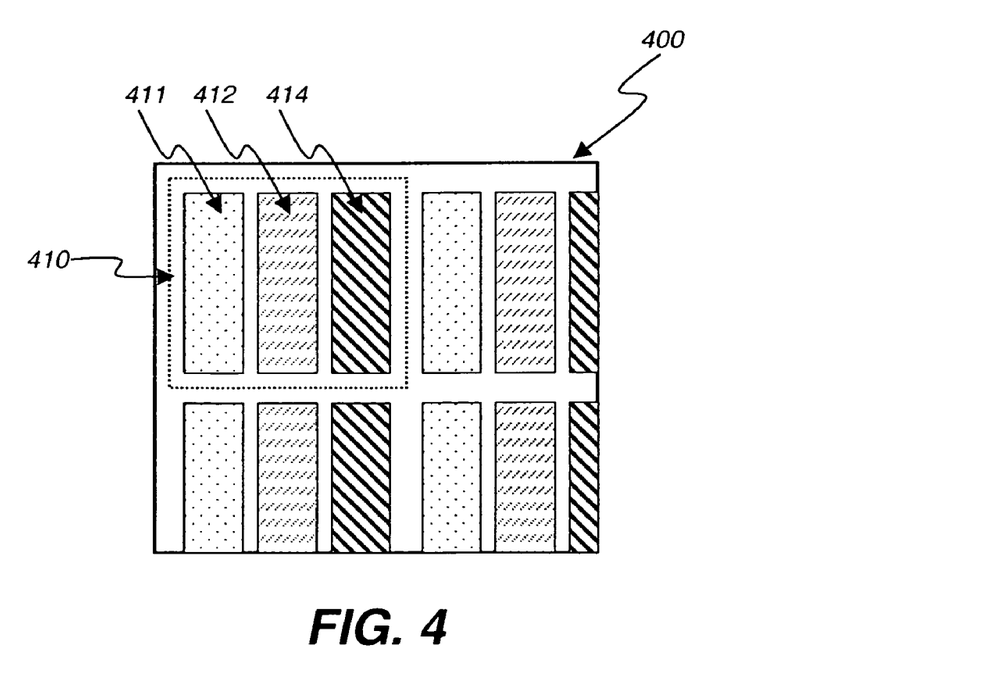
FIG. 4 is a schematic diagram illustrating another pixel pattern in a display in accordance with the present invention.

Shown in FIG. 4 is another pixel pattern of a visible and invisible image display in accordance with the present invention. Display 400 is comprised of an array of pixels. One of the pixels, pixel 410, includes three radiation subpixels: the visible radiation subpixels 411 and 412, and the invisible radiation subpixel 414. The visible radiation subpixel 411 or 412 can be any device capable of producing a mono-color radiation in the region of visible spectrum. Since there are two visible radiation subpixels in each pixel, the resulting radiation perceived by the human eyes can be multi-color radiations in the region of visible spectrum. The invisible radiation subpixel 414 can be any device capable of producing an invisible radiation, such as an infrared radiation. Thus, the display is capable of selectively producing multi-color or infrared images. The multi-color radiations produced from each pixel can be any combination of two radiations selected from the red-, pink-, magenta-, orange-, yellow-, green-, cyan-, olive-, royal-, navy-, blue-, or a purple-, color radiation, and wherein the multi-color radiations can, but not limited to, have a spectral FWHM of greater than 150 nm.

Figure 5:
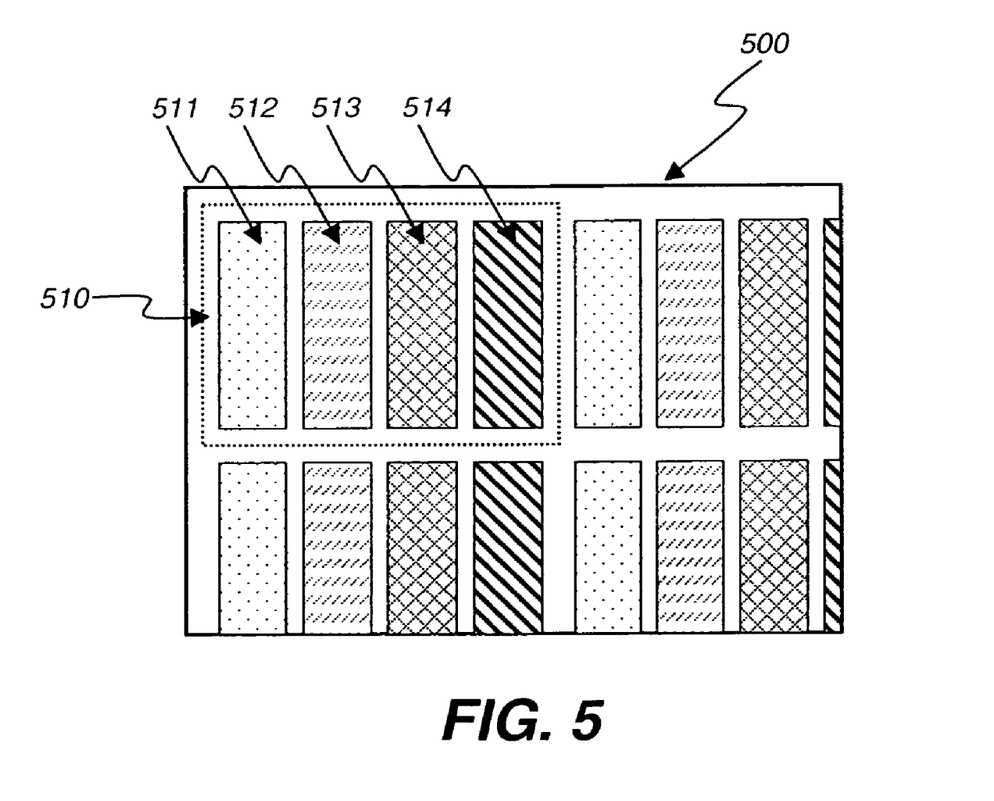
FIG. 5 is a schematic diagram illustrating yet another pixel pattern in a display in accordance with the present invention.

Shown in FIG. 5 is yet another pixel pattern of a visible and invisible image display in accordance with the present invention. Display 500 is comprised of an array of pixels. One of the pixels, pixel 510, includes four radiation subpixels: the visible radiation subpixels 511, 512, and 513, and the invisible radiation subpixel 514. The visible radiation subpixel 511, 512, or 513 can be any device capable of producing a mono-color radiation in the region of visible spectrum. Since there are three visible radiation subpixels in each pixel, the resulting radiation perceived by the human eyes can be full-color radiations in the region of visible spectrum. The invisible radiation subpixel 514 can be any device capable of producing an invisible radiation, such as an infrared radiation. Thus, the display is capable of selectively producing full-color or infrared images. In order to produce full-color images from the display, one of the three visible radiation subpixels in each of the pixels, such as the visible radiation subpixels 511 in pixel 510, produces a red-color radiation, one of the three visible radiation subpixels in each of the pixels, such as the visible radiation subpixels 512 in pixel 510, produces a green-color radiation, and one of the three visible radiation subpixels in each of the pixels, such as the visible radiation subpixels 513 in pixel 510, produces a blue-color radiation.

Moreover, the display can also provide a plurality of pixels wherein each pixel includes one or more visible radiation subpixels capable of producing white radiations in the region of visible spectrum and one invisible radiation subpixel capable of producing an infrared radiation to the human eyes. Therefore, the display is capable of selectively producing black and white images or infrared images.

As aforementioned, the radiation subpixels in each pixel in the display in accordance with the present invention can be any device capable of emitting, transmitting, or reflecting visible or invisible radiations. For example, the pixels of the display can be comprised of OLEDs, and these OLEDs are capable of emitting the light having the color of red, pink, magenta, orange, yellow, green, cyan, olive, royal, navy, blue, purple, or infrared. The pixels of the display can be comprised of LEDs, and these LEDs are capable of emitting the light having the color of red, pink, magenta, orange, yellow, green, cyan, olive, royal, navy, blue, purple, or infrared. The pixels of the display can also be comprised of liquid crystal cells, and these liquid crystal cells are capable of transmitting or reflecting the light having the color of red, pink, magenta, orange, yellow, green, cyan, olive, royal, navy, blue, purple, or infrared. Preferably, the pixels of the display are comprised of OLEDs because there is generally no limitation for selecting substrate to make OLED display and OLEDs can emit high luminance with any desired color.

Figure 6:
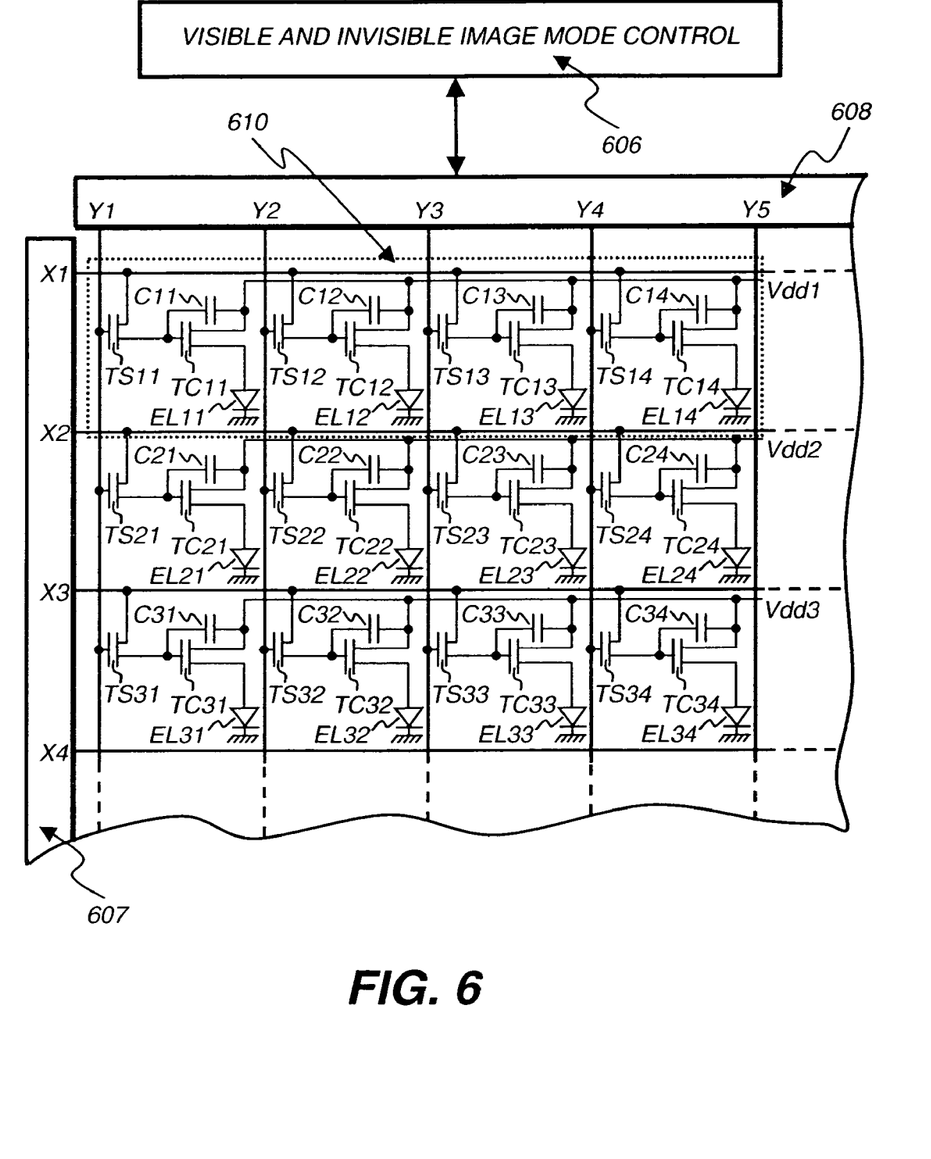
FIG. 6 depicts a cutaway view of a circuit diagram that can be used for driving an active matrix OLED display in accordance with the present invention.

In order to operate the visible and invisible image display, a controlling circuitry is needed. For example, shown in FIG. 6 is a cutaway view of a circuit diagram that can be used for driving an active matrix OLED display in accordance with the present invention. Similar to the active matrix in FIG. 2, the active matrix in FIG. 6 is composed of X-direction driving circuit 607, Y-direction driving circuit 608, and an array of pixels. One of the pixels is indicated as pixel 610 containing a red OLED EL11, a green OLED EL12, a blue OLED EL13 and an infrared OLED EL14. Pixel 610 can be referred to pixel 510 in FIG. 5. EL11, EL12, EL13 and EL14 can be referred to radiation subpixels 511, 512, 513 and 514, respectively, in FIG. 5. Including in the active matrix are also X-direction signal lines (Xm): X1, X2, X3, X4, . . . , Y-direction signal lines (Yn): Y1, Y2, Y3, Y4, Y5, . . . , and power supply lines (Vddm): Vdd1, Vdd2, Vdd3, . . . In the array of pixels, the TFTs used for switching are (TSmn): TS11, TS12, TS13, TS14, . . . , TS21, TS22, TS23, TS24, . . . , TS31, TS32, TS33, TS34, . . . ; the TFTs used for current control are (TCmn): TC11, TC12, TC13, TC14, . . . , TC21, TC22, TC23, TC24, . . . , TC31, TC32, TC33, TC34, . . . ; the radiation subpixels are OLED (ELmn): EL11, EL12, EL13, EL14, . . . , EL21, EL22, EL23, EL24, . . . , EL31, EL32, EL33, EL34, . . . ; and the capacitors are (Cmn): C11, C12, C13, C14, . . . , C21, C22, C23, C24, . . . , C31, C32, C33, C34, . . . . In this active matrix, each of the radiation subpixels can be individually controlled or selected by one of X-direction signal lines and one of Y-direction signal lines. For example, when the switching TFT TS11 is made the "on" state by X-direction signal line X1 and Y-direction signal line Y1, the current control TFT TC11 comes the "on" state accordingly. Thus, an electric current supplied from a power supply line Vdd1 flows in the OLED EL11, which results in red radiation.

In addition, included in the display in FIG. 6 is a visible and invisible image mode control circuit 606. The image mode control circuit 606 can switch the image mode between the visible image mode and the invisible image mode. When the visible image mode is "on", the forth Y-direction signal line connecting each pixel is "off" to keep the invisible radiation subpixel in each pixel at the "off" state; when the invisible image mode is "on", the first three Y-direction signal lines connecting each pixel are "off" to keep the three visible radiation subpixels in each pixel at the "off" state. Based on the operational principle, when the image mode control circuit 606 is switched to the visible image mode, if any one of the three visible radiation subpixels in pixel 510 is "on" at a time, red, green, or blue color can be seen at that time; if any two of the three visible radiation subpixels in pixel 610 are "on" at the same time, the combined color of red with green, red with blue, or green with blue can be seen at the same time; if all of the three visible radiation subpixels are "on" at the same time, a white color can be seen. Furthermore, if each visible radiation subpixel emits light with adjustable intensity, more combined colors can be seen. In other words, pixel 610 can not only emit the three primary colors but also emit different colors other than the primary colors in the whole region of the visible spectrum. When the image mode control circuit 606 is switched to the invisible image mode, if the switching TFT TS14 is made the "on" state by X-direction signal line X1 and Y-direction signal line Y4, the current control TFT TC14 comes the "on" state accordingly. Thus, an electric current supplied from a power supply line Vdd1 flows in the OLED EL14, which results in invisible radiation, such as an infrared radiation if EL14 is an OLED capable of emitting infrared. Thus, according to the control of the X-direction signal lines and the Y-direction signal lines, this display is capable of producing an invisible image, such as an infrared image.

The electronic circuitry provides a secure switch to switch between the visible image mode and the invisible image mode. When the display is on the invisible image mode, the switch cannot be accidentally switched from the invisible image mode to the visible image mode. Moreover, when this display is used as personal equipment, the size of the displaying area is preferably less than 25 cm×35 cm, the display itself should be waterproof and should be operated with a portable power supply, such as a battery.

The invention has been described in detail with particular reference to certain preferred embodiments thereof, but it will be understood that variations and modifications can be effected within the spirit and scope of the invention.

PARTS LIST 100 display of prior art
110 pixel
111 red radiation subpixel (one of the visible radiation subpixels)
112 green radiation subpixel (one of the visible radiation subpixels)

113 blue radiation subpixel (one of the visible radiation subpixels)
207 X-direction driving circuit
208 Y-direction driving circuit
210 pixel
Xm X-direction signal lines where m=1~4
Yn Y-direction signal lines where n=1~5
Vddm power supply lines where m=1~3
TSmn thin film transistors used for switching where m=1~3 and n=1~4
TCmn thin film transistors used for current control where m=1~3 and n=1~4
ELmn OLEDs where m=1~3 and n=1~4
Cmn capacitors where m=1~3 and n=1~4
300 display of present invention
310 pixel
311 visible radiation subpixel
314 invisible radiation subpixel
400 display of present invention
410 pixel
411 visible radiation subpixel
412 visible radiation subpixel
414 invisible radiation subpixel
500 display of present invention
510 pixel
511 red radiation subpixel (one of the visible radiation subpixels)
512 green radiation subpixel (one of the visible radiation subpixels)
513 blue radiation subpixel (one of the visible radiation subpixels)
514 invisible radiation subpixel
606 visible and invisible image mode control circuit
607 X-direction driving circuit
608 Y-direction driving circuit
610 pixel

The invention claimed is:

1. A display for producing either visible or invisible images to the human eyes comprising:
   a) the display includes electronic circuitry and a plurality of pixels wherein each of the pixels includes one or more visible radiation subpixels capable of producing visible radiations to the human eyes and at least one invisible radiation subpixel capable of producing invisible radiations to the human eyes; and
   b) means for causing the electronic circuitry for selectively operating the display to activate either visible or invisible radiation subpixels to respectively producing visible or invisible images to the human eyes and the electronic circuitry having a secure switch to change the display between a visible image mode and an invisible image mode, and wherein the switch cannot be accidentally switched from the invisible image mode to the visible image mode.

2. The display of claim 1 wherein each of the pixels includes one visible radiation subpixel capable of producing a mono-color radiation in the region of visible spectrum, wherein each of the pixels includes one invisible radiation subpixel capable of producing an infrared radiation, and wherein the display is capable of selectively producing mono-color or infrared images to the human eyes.

3. The display of claim 2 wherein the mono-color radiation is a red-, pink-, magenta-, orange-, yellow-, green-, cyan-, olive-, royal-, navy-, blue-, or a purple-, color radiation having a spectral full width at half maximum of less than 150 nm.

4. The display of claim 1 wherein each of the pixels includes two visible radiation subpixels capable of producing multi-color radiations in the region of visible spectrum, wherein each of the pixels includes one invisible radiation subpixel capable of producing an infrared radiation, and wherein the display is capable of selectively producing multi-color or infrared images to the human eyes.

5. The display of claim 4 wherein the multi-color radiations are any combination of two radiations selected from the red-, pink-, magenta-, orange-, yellow-, green-, cyan-, olive-, royal-, navy-, blue-, and the purple-, color radiation, and wherein the multi-color radiations, and wherein the multi-color radiations have a spectral full width at half maximum of greater than 150 nm.

6. The display of claim 1 wherein each of the pixels includes three visible radiation subpixels capable of producing full-color radiations in the region of visible spectrum, wherein each of the pixels includes one invisible radiation subpixel capable of producing an infrared radiation, and wherein the display is capable of selectively producing full-color or infrared images to the human eyes.

7. The display of claim 6 wherein one of the three visible radiation subpixels in each of the pixels produces a red-color radiation, wherein one of the three visible radiation subpixels in each of the pixels produces a green-color radiation, and wherein one of the three visible radiation subpixels in each of the pixels produces a blue-color radiation.

8. The display of claim 1 wherein the display is capable of selectively producing black and white images or infrared images to the human eyes.

9. The display of claim 1 wherein the pixels are comprised of organic light-emitting diodes.

10. The display of claim 9 wherein the organic light-emitting diodes we capable of emitting the light having the color of red, pink, magenta, orange, yellow, green, cyan, olive, royal, navy, blue, purple, or infrared.

11. The display of claim 1 wherein the pixels are comprised of inorganic light-emitting diodes.

12. The display of claim 11 wherein the inorganic light-emitting diodes are capable of emitting the light having the color of red, pink, magenta, orange, yellow, green, cyan, olive, royal, navy, blue, purple, or infrared.

13. The display of claim 1 wherein the pixels are comprised of liquid crystal cells.

14. The display of claim 13 wherein the liquid crystal cells are capable of transmitting or reflecting the light having the color of red, pink, magenta, orange, yellow, green, cyan, olive, royal, navy, blue, purple, or infrared.

15. The display of claim 1 wherein the size of the displaying area is less than 25 cm ×35 cm.

16. A method for producing either visible or invisible images to the human eyes on a display comprising:
   a) providing electronic circuitry in the display and having a plurality of pixels wherein each pixel includes one or more visible radiation subpixels capable of producing visible radiations to the human eyes and at least one invisible radiation subpixel capable of producing invisible radiation to the human eyes; and
   b) causing the electronic circuitry to selectively operate the display to activate visible or invisible radiation subpixels to thereby produce visible or invisible images to the human eyes and providing a secure switch in the electronic circuitry to change the display between a visible image mode and an invisible image mode, and wherein the switch cannot be accidentally switched from the invisible image mode to the visible image mode.

17. The method of claim 16 comprising:
   a) providing a plurality of pixels wherein each pixel includes one visible radiation subpixel capable of producing a mono-color radiation in the region of visible spectrum and one invisible radiation subpixel capable of producing an infrared radiation to the human eyes; and b) selectively operating the display to activate visible or invisible radiation subpixels to thereby produce mono-color or infrared images to the human eyes.

18. The method of claim 16 comprising:

a) providing a plurality of pixels wherein each pixel includes two visible radiation subpixels capable of producing multi-color radiations in the region of visible spectrum and one invisible radiation subpixel capable of producing an infrared radiation to the human eyes; and b) selectively operating the display to activate visible or invisible radiation subpixels to thereby produce multi-color or infrared images to the human eyes.

19. The method of claim 16 comprising:

a) providing a plurality of pixels wherein each pixel includes three visible radiation subpixels capable of producing full-color radiations in the region of visible spectrum and one invisible radiation subpixel capable of producing an infrared radiation to the human eyes; and b) selectively operating the display to activate visible or invisible radiation subpixels to thereby produce full-color or infrared images to the human eyes.

20. The method of claim 16 comprising:

a) providing a plurality of pixels wherein each pixel includes one or more visible radiation subpixels capable of producing white radiations in the region of visible spectrum and one invisible radiation subpixel capable of producing an infrared radiation to the human eyes; and b) selectively operating the display to activate visible or invisible radiation subpixels to thereby produce white and black images or infrared images to the human eyes.

* * * * *

UNITED STATES PATENT AND TRADEMARK OFFICE
CERTIFICATE OF CORRECTION

| | |
|---|---|
| PATENT NO. | : 7,532,181 B2 |
| APPLICATION NO. | : 11/185640 |
| DATED | : May 12, 2009 |
| INVENTOR(S) | : Ching W. Tang et al. |

It is certified that error appears in the above-identified patent and that said Letters Patent is hereby corrected as shown below:

Title Page, Column 2, line 15    Delete "Drazaic" and insert -- Drzaic --, therefor.
Column 7, line 67    In Claim 4, delete ".subpixels" and insert -- subpixels --, therefor.
Column 8, line 32    In Claim 10, delete "we" and insert -- are --, therefor.

Signed and Sealed this

Nineteenth Day of January, 2010

David J. Kappos
*Director of the United States Patent and Trademark Office*